(12) United States Patent
Hansen et al.

(10) Patent No.: US 9,167,733 B2
(45) Date of Patent: Oct. 20, 2015

(54) INTERCONNECTION STRUCTURE IN ELECTROMAGNETIC SHIELDING

(71) Applicant: Conductive Composites Company, LLC, Heber City, UT (US)

(72) Inventors: George Clayton Hansen, Midway, UT (US); Nathan D. Hansen, Heber, UT (US)

(73) Assignee: Conductive Composites Company, Heber City, UT (US)

( * ) Notice: Subject to any disclaimer, the term of this patent is extended or adjusted under 35 U.S.C. 154(b) by 0 days.

(21) Appl. No.: 13/857,927

(22) Filed: Apr. 5, 2013

(65) Prior Publication Data

US 2013/0220693 A1 Aug. 29, 2013

Related U.S. Application Data

(62) Division of application No. 12/698,961, filed on Feb. 2, 2010, now Pat. No. 8,415,568.

(60) Provisional application No. 61/149,116, filed on Feb. 2, 2009.

(51) Int. Cl.
*H05K 9/00* (2006.01)

(52) U.S. Cl.
CPC .............. *H05K 9/0009* (2013.01); *H05K 9/00* (2013.01); *H05K 9/0081* (2013.01); *H05K 9/0083* (2013.01); *H05K 9/0084* (2013.01); *H05K 9/0086* (2013.01); *H05K 9/0088* (2013.01)

(58) Field of Classification Search
CPC .................................................... H05K 9/0088
USPC ......................... 174/382, 386, 394; 361/818
See application file for complete search history.

(56) References Cited

U.S. PATENT DOCUMENTS

| 6,344,978 B1 * | 2/2002 | Komiya .................... 361/816 |
| 7,183,484 B1 | 2/2007 | May |
| 2008/0078576 A1 | 4/2008 | Blacker et al. |

* cited by examiner

*Primary Examiner* — Hung V Ngo
(74) *Attorney, Agent, or Firm* — Madson IP, P.C.

(57) ABSTRACT

A panel for an electromagnetic shield includes a light-weight, porous, electrically-conductive, fluid-permeable planar core layer defined between generally parallel first and second surfaces and a first face sheet laminated to the first surface of the core layer with rigidity properties superior to the rigidity properties of the core layer. The thickness of the first face sheet is substantially less than the thickness of the core layer. The core layer is made of metallic foam or a metal coating on an electrically-nonconductive, porous, nonmetallic substrate chosen from among nonwoven fibrous matting, paper, and open-cell nonmetallic foam. Also, the core layer may also may be made up of liberated branching metal nanostrands or a plurality of electrically-coupled, electrically-conductive particles, each taking the from of an electrically-nonconductive, nonmetallic substrate with a metal coating. The first face sheet includes a cured layer of resin and, distributed throughout the resin, electrically-conductive elements selected from among liberated branched metal nanostrands, metal wires, and metal meshes, in addition to fibers, woven fabric, nonwoven matting, or paper that are metal-coated.

12 Claims, 4 Drawing Sheets

INTERCONNECTION STRUCTURE IN ELECTROMAGNETIC SHIELDING

CROSS-REFERENCED AND RELATED APPLICATIONS

This application is a divisional of U.S. patent application Ser. No. 12/698,961, filed Feb. 2, 2010 ("Parent Application"), which is incorporated by this reference. The Parent Application claims the benefit of and is a continuation-in-part application of U.S. Provisional Application Ser. No. 61/149,116 that was filed on Feb. 2, 2009, which is incorporated by this reference.

This application is related by subject matter to each of the following pending United States patent applications, which are individually and collectively incorporated herein by reference:

a. U.S. patent application Ser. No. 10/414,266;
b. U.S. patent application Ser. No. 11/609,113;
c. U.S. patent application Ser. No. 12/260,999; and
d. U.S. patent application Ser. No. 12/261,006.

BACKGROUND OF THE INVENTION

1. Field of the Invention

The present invention relates to the design of electromagnetic shielding. More particularly, the present invention pertains to panels capable of providing electromagnetic shielding for an interior space.

2. Background

Optimum electromagnetic shielding offers broadband protection from very low frequencies on the order of a few kilohertz to very high frequencies on the order of tens of gigahertz. Electromagnetic signals at low frequencies have long wavelengths, while electromagnetic signals of high frequencies exhibit short wavelengths. Signals of different wavelengths interact differently with any electromagnetic-shielding material.

Fundamental material properties impact the capability of a material to shield from electromagnetic signals. The most significant of these are electrical conductivity, magnetic permeability, thickness, and geometric morphology. The most relevant of these material variables is dictated by the situation of use, as for example, by the intensity of anticipated electromagnetic radiation, or by whether the radiation is emitted from a proximate near field source or a remote far domain source.

Polymer systems and fiber-reinforced composite materials play an increasingly important structural role in many contemporary applications. These materials exhibit high specific stiffness and strength. Many are advantageously easy to manufacture and assemble. Still, as a group such polymer and composite systems exhibit poor electrical properties, and are not, therefore, particularly recommended for use in electromagnetic shielding.

BRIEF SUMMARY OF THE INVENTION

According to an initial aspect of the present invention, a panel for an electromagnetic shield includes a light-weight, porous, electrically-conductive planar core layer defined between generally parallel first and second surfaces and a first face sheet laminated to the first surface of the core layer and having rigidity properties superior to the rigidity properties of the core layer. The core layer is made of a fluid-permeable material. The distance between the first and second surfaces of the core layer defines a thickness of the core layer, and the thickness of the first face sheet is substantially less than the thickness of the core layer.

In one embodiment, the core layer is made of metallic foam. Another embodiment includes a metal coating on an electrically-nonconductive, porous, nonmetallic substrate chosen from a group of materials that includes nonwoven fibrous matting, paper, and open-cell nonmetallic foam. Alternatively, the core layer is made up of liberated branching metal nanostrands or a plurality of electrically-coupled, electrically-conductive particles. Each of the particles takes the form of an electrically-nonconductive, nonmetallic substrate with a metal coating.

The first face sheet includes a cured layer of resin electrically-conductive elements distributed throughout the resin. The electrically-conductive elements are selected from among a group including liberated branched metal nanostrands, metal wires, and metal meshes, or electrically-conductive elements in the first face sheet are selected from a group of electrically-conductive elements are metal-coated fibers, woven fabric, nonwoven matting, or paper. Both being electrically-conductive, between the first face sheet and the first surface of the core is interposed an electrically-conductive adhesive layer.

The inventive panel may also include a fluid-impermeable second face sheet that is laminated to the second surface of the core layer. The second face sheet has rigidity properties superior to the rigidity properties of the core layer. A first aperture is formed through the first face sheet, and a second aperture is formed through the second face sheet opposite the first aperture. The first aperture and the second aperture together render the composite panel fluid-permeable in the vicinity of the first and second apertures. When the second face sheet is electrically-conductive, and the panel also includes an electrically-conductive adhesive layer between the second face sheet and the second surface of the core layer.

In another aspect of the present invention, an interconnection structure in an electromagnetic shield includes a first electromagnetic shield panel bounded at a periphery thereof by a joint edge, a second electromagnetic shield panel bounded at a periphery thereof by a joint edge, and joinder means for securing the joint edge of the first panel to the joint edge of the second panel with electrically-conductive components of the first panel in electrical communication with electrically-conductive components of the second panel. Examples of structures capable of performing the function of the joinder means are a butt joint between the joint edge of the first panel and the joint edge of the second panel and a lap joint between overlapping portions of the first and second panels located adjacent, respectively, to the joint edges thereof.

In such an interconnection structure, the first panel includes a first light-weight, porous, electrically-conductive planar core layer having generally parallel inner and outer surfaces on opposite sides thereof and being bounded at a periphery thereof by a joint edge coincident with the joint edge of the first panel. A first outer face sheet is laminated to the outer surface of the first core layer. The first outer face sheet has rigidity properties superior to the rigidity properties of the first core layer and is bounded at a periphery thereof by a joint edge coincident with the joint edge of the first panel. Correspondingly, the second panel includes a second light-weight, porous, electrically-conductive planar core layer having generally parallel inner and outer surfaces on opposite sides thereof and being bounded at a periphery thereof by a joint edge coincident with the joint edge of the second panel. A second outer face sheet is laminated to the outer surface of the second core layer. The second outer face sheet has rigidity properties superior to the rigidity properties of the second core layer and being bounded at a periphery thereof by a joint edge coincident with the joint edge of the second panel When the first outer face sheet and the second outer face sheet are electrically-conductive, the interconnection structure also includes a first outer electrically-conductive adhesive layer between the outer surface of the first core and the first outer face sheet, and a second outer electrically-conductive adhesive layer between the outer surface of the second core and the second outer face sheet. Optionally, the interconnection structure may also include an electrically-conductive first inner face sheet having rigidity properties superior to the rigidity properties of the first core layer and being bounded at a periphery thereof by a joint edge coincident with the joint edge of the first panel, a first inner electrically-conductive adhesive layer between the inner surface of the first core and the first inner face sheet, an electrically-conductive second inner face sheet having rigidity properties superior to the rigidity properties of the second core layer and being bounded at a periphery thereof by a joint edge coincident with the joint edge of the second panel, and a second inner electrically-conductive adhesive layer between the inner surface of the second core and the second inner face sheet.

According to yet another aspect of the present invention, an electromagnetically-shielding enclosure for an interior space is made up of a plurality of electromagnetic shield panels disposed in a three-dimensional array surrounding the interior space, each of the panels being bounded at the periphery thereof by a sequence of circumscribing edges and joinder means for securing the edges of adjacent of the panels in the three-dimensional array with electrically-conductive components of the adjacent of the panels in electrical communication. Each of the panels includes a light-weight, porous, electrically-conductive planar core layer having generally parallel inner and outer surfaces on opposite sides thereof, and an outer face sheet laminated to the outer surface of the core layer. The outer face sheet has rigidity properties superior to the rigidity properties of the core layer. The core layer in each of the panels in the three-dimensional array is fluid-permeable as is also the outer face sheet in each of the panels. An outer aperture is formed through an outer face sheet of a selected panel in the three-dimensional array. The enclosure optionally also has a fluid-impermeable inner face sheet laminated to the inner surface of the core layer in each of the panels in the three-dimensional array. The inner face sheet has rigidity properties superior to the rigidity properties of the core layer associated therewith. Then an outer aperture is formed through an outer face sheet of a selected panel in the three-dimensional array, and an inner aperture is formed through the inner face sheet of the selected panel in the three-dimensional array at a location opposite the outer aperture.

Another aspect of the present invention pertains to a cooling panel for an enclosure for a heat-generating device. The cooling panel includes a generally planar screen of fluid-permeable, thermally-conductive metal having first and second surfaces on opposite sides thereof and flow control means for directing fluid to and from the heat-generating device through a selected region of the screen. The screen may advantageously be comprised of metal foam. The flow control means may take the from of a fluid-impermeable first face sheet laminated to the first surface of the screen in regions thereof other than the selected region and a fluid-impermeable second face sheet laminated to of second surface of the screen in regions thereof other than the selected region. If the first face sheet is electrically-conductive, the cooling panel also includes an electrically-conductive adhesive layer between the first face sheet and the first surface of the screen.

The teachings of present invention also includes methodologies. For example, within the scope of the present invention are methods for electromagnetically shielding an interior space and methods for manufacturing a temperature control panel for an electromagnetic shield.

BRIEF DESCRIPTION OF THE SEVERAL VIEWS OF THE DRAWINGS

In order that the manner in which the above-recited and other features and advantages of the present invention are obtained will be readily understood, a more particular description of the present invention briefly described above will be rendered by reference to specific embodiments thereof which are illustrated in the appended drawings. Understanding that these drawings depict only typical embodiments of the present invention and are not therefore to be considered to be limiting of scope thereof, the present invention will be described and explained with additional specificity and detail through the use of the accompanying drawings in which.

DETAILED DESCRIPTION OF THE INVENTION

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the present invention, as represented in FIGS. 1-4, is not intended to limit the scope of the invention, as claimed, but is merely representative of presently preferred embodiments of the invention.

Figure 1:
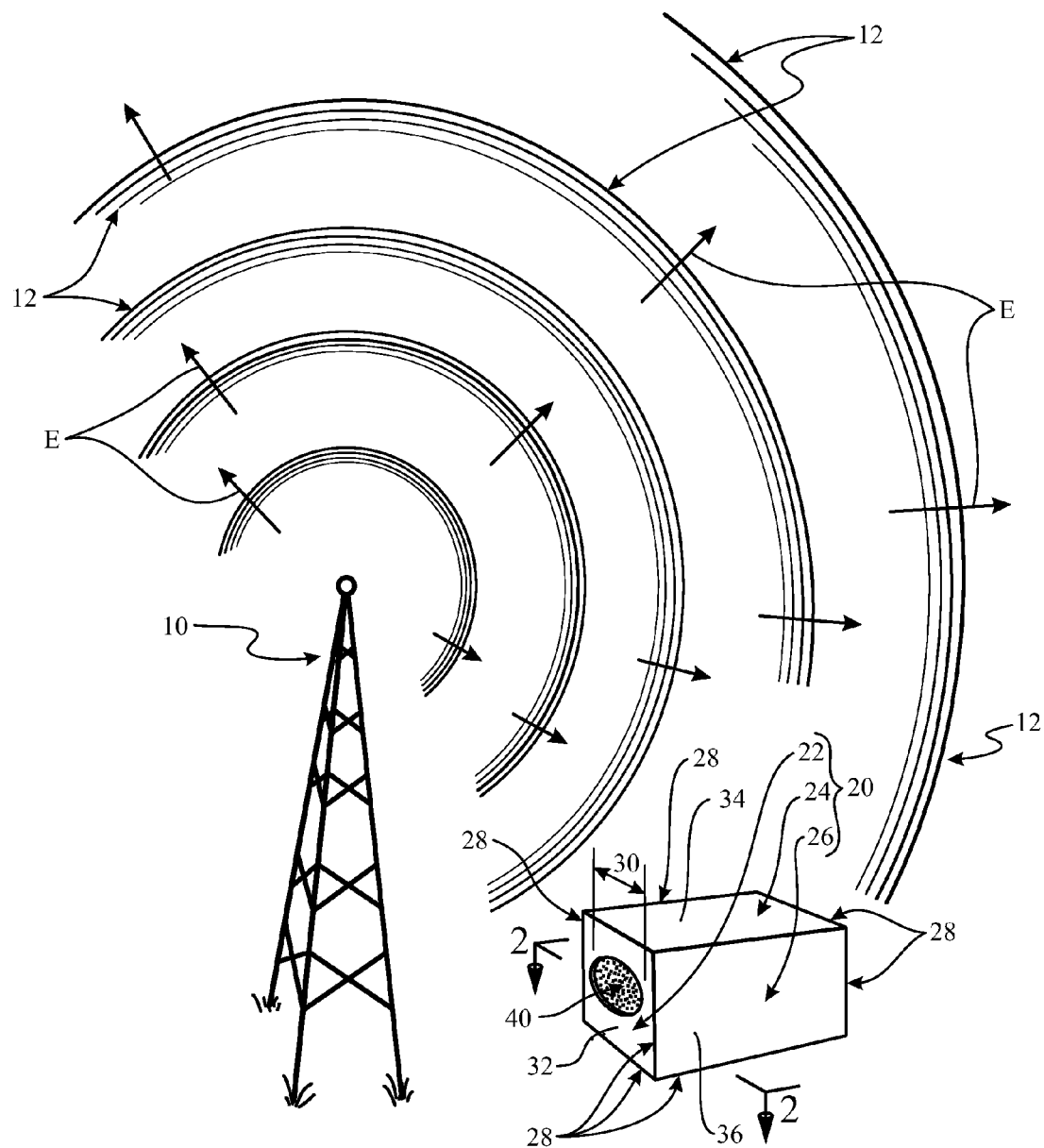
FIG. 1 is an illustrative depiction of a source of electromagnetic signal radiation and an enclosure for an interior space that, by incorporating teachings of the present invention, provides broadband electromagnetic shielding for that interior space.

FIG. 1 depicts a typical environment in which teachings of the present invention find utility. There a radio transmitter tower 10 is shown as a typical source of outgoing electromagnetic signal radiation 12 that travels outwardly away from radio transmitter tower 10, as suggested by arrows E. Shielding from electromagnetic signal radiation 12 is desired on behalf of a sensitive electronic device within the transmission range of transmitter tower 10.

Toward that end, the electronic device, which is not actually visible in FIG. 1, is housed in an electromagnetic-shielding enclosure 20 that incorporates teachings of the present invention. Electromagnetic-shielding enclosure 20 thus provides broadband electromagnetic shielding from electromagnetic signal radiation 12 for the interior space within electromagnetic-shielding enclosure 20. As seen by way of example in FIG. 1, electromagnetic-shielding enclosure 20 includes a square electromagnetic-shielding front panel 22, a rectangular electromagnetic-shielding top panel 24, and a similarly shaped electromagnetic-shielding side panel 26. Panels 24, 26, and 28 meet and are attached in an electrically coupled manner at respective joints 28 between each pair thereof. As a result, electromagnetic signal radiation 12 is precluded from penetrating into the interior of electromagnetic shielding side panel 26 or interfering with the intended operation of the electronic device housed therewithin.

An electromagnetic-shielding enclosure, such as electromagnetic-shielding enclosure 20, may assume diverse configurations, involving assemblies with greater or lesser symmetry, with irregular or nonplanar outer surfaces, with more or fewer panels and more or fewer joints therebetween than are included in electromagnetic-shielding enclosure 20. For example, an electromagnetic-shielding enclosure, such as electromagnetic-shielding enclosure 20, may take the form of a pair of semispherical electromagnetic-shielding panels that are attached in an electrically coupled manner at a single continuous circumferential joint. As used herein and applied to an electromagnetic-shielding panel, the expressions planar and substantially planar are intended to include even electromagnetic-shielding panels that, while exhibiting curvatures or being flexibility, have a thickness between the opposite surfaces thereof that is substantially unchanging throughout the entire electromagnetic-shielding panel.

In FIG. 1, front panel 22 of electromagnetic-shielding enclosure 20 can be seen to include a centrally-positioned, generally oval region 30 that has an appearance from the exterior of electromagnetic-shielding enclosure 20 that differs from the appearance of the balance of the outer surface 32 of front panel 22. As will be discussed in further detail subsequently, oval region 30 functions as a temperature control vent 40 through which any heat produced by the electronic device within electromagnetic-shielding enclosure 20 can be safely dissipated. While outer surface 34 of top panel 24 and outer surface 36 of side panel 26 are shown as having uniform surface appearances, either or both of panels 24 and 26 could with ease include one or plural regions capable of functioning in the same manner as temperature control vent 40.

The physical and material considerations governing the formation of panels 24, 26, and 28 and temperature control window 40 will be addressed following a brief discussion of some of material properties that impact the capability of the constituent materials of panels 24, 26, and 28 to effectively shield the interior of electromagnetic-shielding enclosure 20 from electromagnetic signals 12.

One characteristic of electromagnetic waves is wave impedance. This is defined as the ratio of the electric field (E-field, volts per meter) to the magnetic field (H-field, amps per meter) of the electromagnetic radiation. A low impedance wave will have a low E-field and high H-field, and a high impedance wave will have a high E-field and low H-field. Thus, low impedance wave shielding is concerned more with magnetic permeability and absorption, while high impedance wave shielding is concerned more with electrical conductivity.

The shielding effectiveness SE of an electromagnetic-shielding material is expressed in decibel units, and represents the quantity of an electromagnetic field that is attenuated by an electromagnetic-shielding barrier made of the electromagnetic-shielding material in question. The shielding effectiveness SE of a material is calculated using Equation 1 below.

$$SE = R + A + B, \qquad \text{Equation 1}$$

where,
R=reflection shielding mechanism in decibels;
A=absorption shielding mechanism in decibels; and
B=re-reflection shielding mechanism in decibels.

The reflection shielding mechanism R of an electromagnetic-shielding material is expressed in decibel units. Reflection shielding mechanism R is a function variously of (1) the impedance $Z_1$ of an electromagnetic-shielding wave in a medium surrounding an electromagnetic-shielding barrier made of the electromagnetic-shielding material in question, (2) the impedance $Z_2$ of the electromagnetic-shielding wave in the electromagnetic-shielding shielding barrier, (3) the electrical conductivity σ of the electromagnetic-shielding barrier, (4) the magnetic permeability μ of the electromagnetic-shielding barrier, and (5) the frequency f of the electromagnetic-shielding wave itself.

The impedance $Z_2$ of an electromagnetic-shielding wave in an electromagnetic-shielding shielding barrier is calculated using Equation 2 below $$Z_2 = \sqrt{\frac{2\pi f \mu}{\sigma}}, \qquad \text{Equation 2}$$

where,
f=electromagnetic-shielding wave frequency in hertz;
μ=electromagnetic-shielding barrier magnetic permeability in volt-second per ampere per meter; and
σ=electromagnetic-shielding barrier electrical conductivity in siemens per centimeter.

The reflection shielding mechanism R of an electromagnetic-shielding material is calculated using Equation 3 below.

$$R = 20\log\left(\frac{Z_1}{4Z_2}\right), \qquad \text{Equation 3}$$

where,
$Z_1$=impedance in ohms of medium surrounding electromagnetic-shielding barrier; and
$Z_2$=impedance in ohms of electromagnetic-shielding shielding barrier.

The greater the impedance mismatch between an electromagnetic-shielding shield and its surrounding medium, the greater the shielding effectiveness of the electromagnetic-shielding shield. Thus, the use of highly electrically-conductive materials leads to greater reflection.

The absorption shielding mechanism A is expressed in decibels and is calculated using Equation 4 below.

$$A = 20\log e^{\frac{t}{\delta}}, \qquad \text{Equation 4}$$

where,
t=electromagnetic-shielding barrier thickness in length units; and
δ=electromagnetic-shielding barrier skin depth in length units.

An increase in the exponent of Equation 4 is achieved by increasing thickness t or decreasing skin depth δ.

Skin depth δ can be considered to be the depth of penetration into an electromagnetic-shielding barrier by an incident electromagnetic wave at a given frequency. Fundamentally, skin depth δ dictates the loss of amplitude of an incident wave in an electromagnetic-shielding barrier. Thus, a given skin depth will lead to a proportional unit loss of amplitude in any incident electromagnetic wave. For example, a single unit of skin depth typically reduces the amplitude of an electromagnetic wave by 1/e, or about 37%. Thus, reducing the skin depth of an electromagnetic-shielding material leads to reductions in the total required thickness of an electromagnetic-shielding made from the material, while still maintaining electromagnetic shield levels.

Skin depth δ is calculated using Equation 5 below.

$$\delta = \frac{1}{\sqrt{\pi f \sigma \mu}},$$ Equation 5 where,
    f=electromagnetic-shielding wave frequency in hertz;
    σ=electromagnetic-shielding barrier electrical conductivity in siemens per centimeter; and
    μ=electromagnetic-shielding barrier magnetic permeability in volt-second per ampere per meter.

Skin depth δ can be decreased by increasing one or both of electrical conductivity σ and magnetic permeability μ. Skin depth naturally decreases with increasing electromagnet wave frequency f.

Physical and materials considerations of the geometrical morphology of the electromagnetic shield can also have importance. A solid, planar electromagnetic-shielding barrier must rely on its bulk material properties of conductivity and permeability alone for shielding effectiveness. An improved geometric morphology will be disclosed below relative to FIG. 2.

Figure 2:
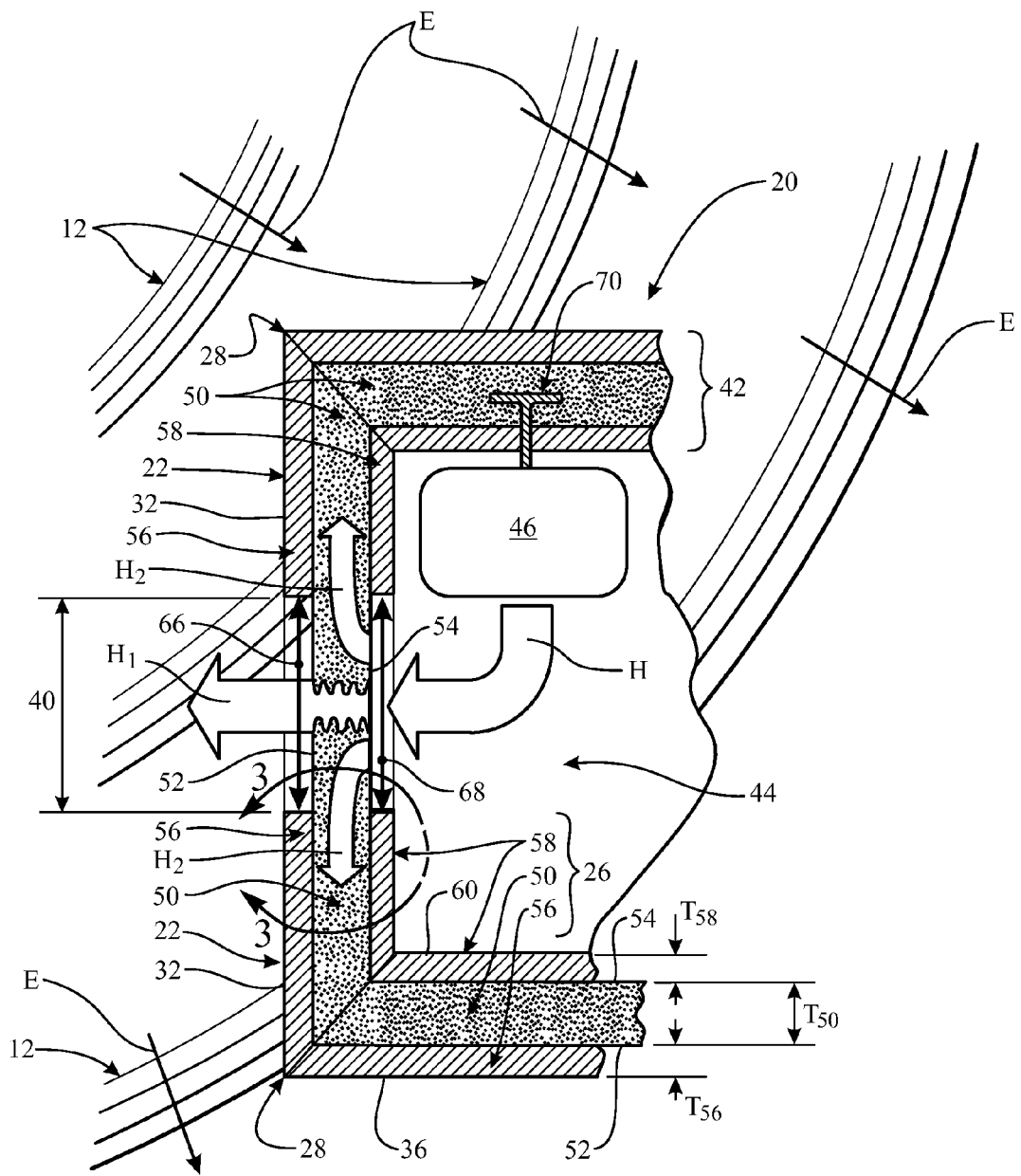
FIG. 2 is a cross section of the enclosure of FIG. 1 taken along section line 2-2 therein.

FIG. 2 is a cross-sectional plan view of front panel 22 of electromagnetic-shielding enclosure 20 between joint 28 at side panel 26 and joint 28 at a second side panel 42 that is not visible in FIG. 1. Also newly revealed in FIG. 2 is a floor panel 44 of electromagnetic-shielding enclosure 20 that is provided with the same electromagnetic shielding capacity as are the other panels of electromagnetic-shielding enclosure 20. Resting upon floor panel 44, interior of electromagnetic-shielding enclosure 20 in the vicinity of joint 28 between front panel 22 and second side panel 42, is an electronic device 46 that is being shielded from electromagnetic signal radiation 12 by electromagnetic-shielding enclosure 20. The normal operation of electronic device 46 produces heat indicated by an arrow H that requires dissipation, if electronic device 46 is to avoid damage and malfunction. How this is accomplished will be disclosed subsequently relative to temperature control vent 40.

Each of the panels of electromagnetic shielding enclosure 20 may be of a unique construction, provided that each panel incorporates appropriate insights from among the teachings of the present invention. For the sake of simplicity herein, however, it will be assumed that the construction of each of the panels of electromagnetic-shielding enclosure 20 is identical, except for the provision of temperature control vent 40 in front panel 22. Thus, the internal construction of side panel 26 will be explored in significant detail as being typical of all of the panels of electromagnetic-shielding enclosure 20, and the same reference characters used to do so in the following discussion will be used without further introduction whenever convenient herein and in the supporting drawings.

Side panel 26 includes a light-weight, porous, electrically-conductive planar core layer 50 having a first surface 52 that is oriented outwardly of electromagnetic-shielding enclosure 20 and a generally parallel second surface 54 on opposite side of core layer 50 that is oriented inwardly of electromagnetic-shielding enclosure 20. The distance between first surface 52 and second surface 54 defines a thickness $T_{50}$ of core layer 50. Laminated to first surface 52 of core layer 50 is a first face sheet 56, and laminated to second surfaces 54 of core layer 50 is a second face sheet 58. The outer surface of first face sheet 56 thus coincides with outer surface 36 of side panel 26, while the outer surface of second face sheet 58 defines an inner surface 60 of side panel 26.

Either or both of first face sheet 56 and second face sheet 58 have rigidity properties that are superior to the rigidity properties of core layer 50. As used herein and applied to face sheets, such as first face sheet 56 and second face sheet 58, superior rigidity properties include superior tensile properties, superior stiffness properties, or superior tensile and stiffness properties combined. When laminated to core layer 50, either of both of first face sheet 56 and second surfaces 54 supplement the mechanical strength of core layer 50, causing side panel 26 to be able to function as a sturdy structural element of any enclosure in which it is included. For this reason, in many, but not necessary in all, occasions, first face sheet 56 has a thickness $T_{56}$ that is substantially less than thickness $T_{50}$ of core layer 50. Similarly, second face sheet 58 may have a thickness $T_{58}$ that is also less than thickness $T_{50}$ of core layer 50. By way of example, thickness $T_{50}$ of core layer 50 may be in the range of about 0.0625 inches, in which case thickness $T_{56}$ of first face sheet 56 and thickness $T_{58}$ of second face sheet 58 might be in the range of about only 0.030 inches.

Core layer 50 may to great advantage be made of metal foam. Alternative, core layer 50 may include a porous nonmetallic substrate and a metal coating on that substrate. The substrate in core layer 50 may be electrically-nonconductive and may be formed from a material selected from a group of materials comprising nonwoven fibrous matting, paper, and open-cell nonmetallic foam. Core layer 50 may also be made of a plurality of electrically-coupled, electrically-conductive particles. The electrically-conductive particles may be liberated branching metal nanostrands, or each of the electrically-conductive particles can be a nonmetallic substrate with a metal coating. Then, the nonmetallic substrate in each of the electrically-conductive particles may itself be electrically-nonconductive. Quite advantageously, core layer 50 is fluid-permeable in some embodiments.

The specific composition of core layer 50 will be explored in additional detail below.

Core layer 50 with the assistance of either or both of first face sheet 56 and second face sheet 58 need not rely on its own bulk material in order to serve as a sturdy structural element of electromagnetic-shielding enclosure 20. Core layer 50 can take the form of a grating, or screen pattern of discreet wires. Further, core layer 50 may have an open pattern built from overlapping interconnected layers of such materials three-dimensionally randomly positioned relative to each other. Such a pattern of overlapped materials results substantially in a physically-obstructed planar barrier to incident electromagnetic waves, such as electromagnetic signal radiation 12, but such a pattern of overlapped materials allows electromagnetic wave that do penetrate the outermost layers of the pattern to be reflected internally and absorbed within the overlapped materials in the manner of a network of faraday cages within a shielding barrier that trap and dissipate penetrative incident electromagnetic radiation.

Three dimensionally interconnected, open, and conductive porous materials can be made by coating with metal any of a number of substrates, including but not limited to foams, felts, fabrics, pads, scrims, papers, fiber matting, and filter media. Porous media coated with or made of nickel are particularly appropriate for several reasons. First of all, nickel is highly electrically conductive σ and exhibits high magnetic permeability μ. It is seen in the above equations that these material properties are advantageous in electromagnetic shielding, both independently and in combination with other constituent components of a composite structure. Porous media is additionally advantageous in electromagnetic-shielding applications, as providing a three-dimensionally interconnected, conductive grating to incoming radiation, along with a multiplicity of interconnected faraday cages. The use of porous media helps to keep weight to a minimum. Additional advantages, such as heat transfer through either or both of conduction and convection are afforded with a porous media that is thermally-conductive and possessed of a relatively high heat transfer coefficient. Porous media of several sizes can be combined to increase the broadband electromagnetic-shielding effectiveness of a composite. The porous media layers also act as structural or core layers in composite systems.

The key geometry in the above described materials is the nature of the three-dimensional porosity. These kinds of materials can also be used on different scales to achieve different regions of shielding effectiveness. For example, substrates with smaller pores will shield higher frequencies, while substrates with larger pores will shield lower frequencies. The use of flexible or compressible porous media, such as nickel coated foam is recommended. With porous foam materials, the compressibility and flexibility of the foam is paramount. These foam materials can be face stitched to metal-coated fabric. While, such a dry sandwich is highly deformable and easily bendable and can serve as creates an excellent electromagnetic-shield material, a dry sandwich of this type is not particularly recommended as a structural material.

As discussed above, however, an electromagnetic-shield panel, such as any panel of electromagnetic-shielding enclosure 20, is much more physically robust than the dry sandwich material discussed above. The use of a laminate composite involving core layer 50 among other layers results in stand-alone shielding layers, such as side panel 26 explored in relation to FIG. 2. Such a laminate composite can serve as a vent for a shielding enclosure, as well as a barrier to electromagnetic radiation, if the core layer thereof is made of a foam material that is both electrically-conductive and thermally-conductive. The shielding effectiveness of composite systems and polymers is improved by using conductive porous materials, either alone or as core layers in structural laminates. Several different materials may be combined to produce any specific desired effect. Unprecedented levels of shielding effectiveness in composite materials have been demonstrated with these conductive porous layers, both alone and in composite systems. Nickel nanostrands, nickel coated fibers, and nickel coated non-woven paper may also be used in these systems to provide an additional region of broadband electromagnetic-shielding effectiveness.

One aspect of the present invention is that electrically-conductive and thermally-conductive foam cores act as foam core stiffeners in composite laminates. For instance, while non-conductive foam cores provide outstanding mechanical stiffness and energy absorption in a composite structure, the incorporation of metal foam cores provides the same mechanical advantages, but incorporates excellent thermal conductivity and electrical conductivity to the composite. The later property lends eltromagnetic-shielding capacity to the composite.

When electrically-conductive foams are properly incorporated between laminate panels, such as the panels of electromagnetic-shielding enclosure 20 that are themselves electrically-conductive, the resulting composite structure displays an increased effective electromagnetic skin depth relative to the electromagnetic skin depth of the core foam material alone. Thus, an electromagnetic-shielding-panel, such as side panel 26 of electromagnetic-shielding enclosure 20, may incorporate face sheets, such as first face sheet 56 and second face sheet 58, that are themselves electrically-conductive. The face sheet may include a cured layer of resin and electrically-conductive elements distributed throughout the layer of resin. Those electrically-conductive elements may be selected from a group of electrically-conductive elements comprising liberated branched metal nanostrands, metal wires, and metal meshes. In the alternative, the electrically-conductive elements are selected from a group of electrically-conductive elements comprising, fibers, woven fabric, non-woven matting, and paper. These may be metal-coated as required by the circumstance of intended use. When an electrically-conductive face sheet is employed, is advantageous to employ an electrically-conductive adhesive layer between the face sheet and the associated surface of the core layer.

A composite panel results that has commendable electrical conductivity and highly effective electromagnetic shielding, but that is yet very light-weight. For instance, panels with surface resistivity of a few milliohms and a volume resistivity equal to or less than of a few milliohm-cm have been fabricated. These same panels, while being highly conductive and acting as very electromagnetically thick-skinned shields for low frequency electromagnetic signals, also exhibit the light weight and high stiffness of foam core laminate composites. Composites with a density less than 1.00 gm/cc and a stiffness that is approximately equivalent to that of aluminum have been produced, and these exhibit electromagnetic-shielding capabilities that are beyond the limit of available electromagnetic test methodologies.

Another advantageous result from the use of porous core structures is that the porous core can not only shield electromagnetic radiation, but also allow fluid to pass through the material of the core itself. Thus, an electrically-conductive, porous core layer will allow the circulation of air or other fluids therethrough, and this feature can be exploited on behalf of the dissipation or transfer of heat through the core layer. The use of wire mesh or woven materials to accomplish this has been suggested above, but the use of foam geometry creates increased broadband electromagnetic shielding.

The maintenance of fluid-permeability in the overall structure of a composite laminate panel, such as the panels of electromagnetic-shielding enclosure 20, accounts for the structures in FIG. 2 associated with temperature control vent 40. While core layer 50 of front panel 22 is fluid-permeable in the manner described immediately above, either of both of first face sheet 56 and second face sheet 58 may often be fluid-impermeable. In such cases, it is necessary to remove some portion of each face sheet wherever fluid flow and correspondingly heat transfer is intended to occur through front panel 22.

Thus according to another aspect of the present invention, flow control means are provided for directing fluid through a selected region of core layer 50 to and from a heat-generating device, such as electronic device 46. As shown by way of example in FIG. 2, a first aperture 66 is formed through first face sheet 56, and second aperture 68 is formed through second face sheet 58 opposite first aperture 66. First aperture 66 and second aperture 68 render front panel 22 fluid-permeable in the vicinity of a first aperture 66 and second aperture 68. As a result, some portion of the heat generated by electronic device 46 that might otherwise be trapped within electromagnetic shielding enclosure 20 is able to escape through core layer 50 as fluid passes therethrough. Such a convection of heat is indicated by arrow $H_1$ in FIG. 2. Where the material of core layer 50 is not only porous but thermally conductive, some of the heat from electronic device 46 that might otherwise be trapped within electromagnetic shielding enclosure 20 is transferred to the material of core layer 50 and conducted directly through core layer 50 away from temperature control vent 40. Such a conduction of heat is indicated by arrows $H_2$ in FIG. 2.

It may be desirable to thermally couple a heat source, such as electronic device 46, to core layer 50 of front panel 22 directly, thereby to conduct heat to core layer 50 directly. Toward that end, as shown schematically by way of example in FIG. 2, a thermally-conductive element 70 extends from electronic device 46 into core layer 50 of second side panel 42.

Figure 3:
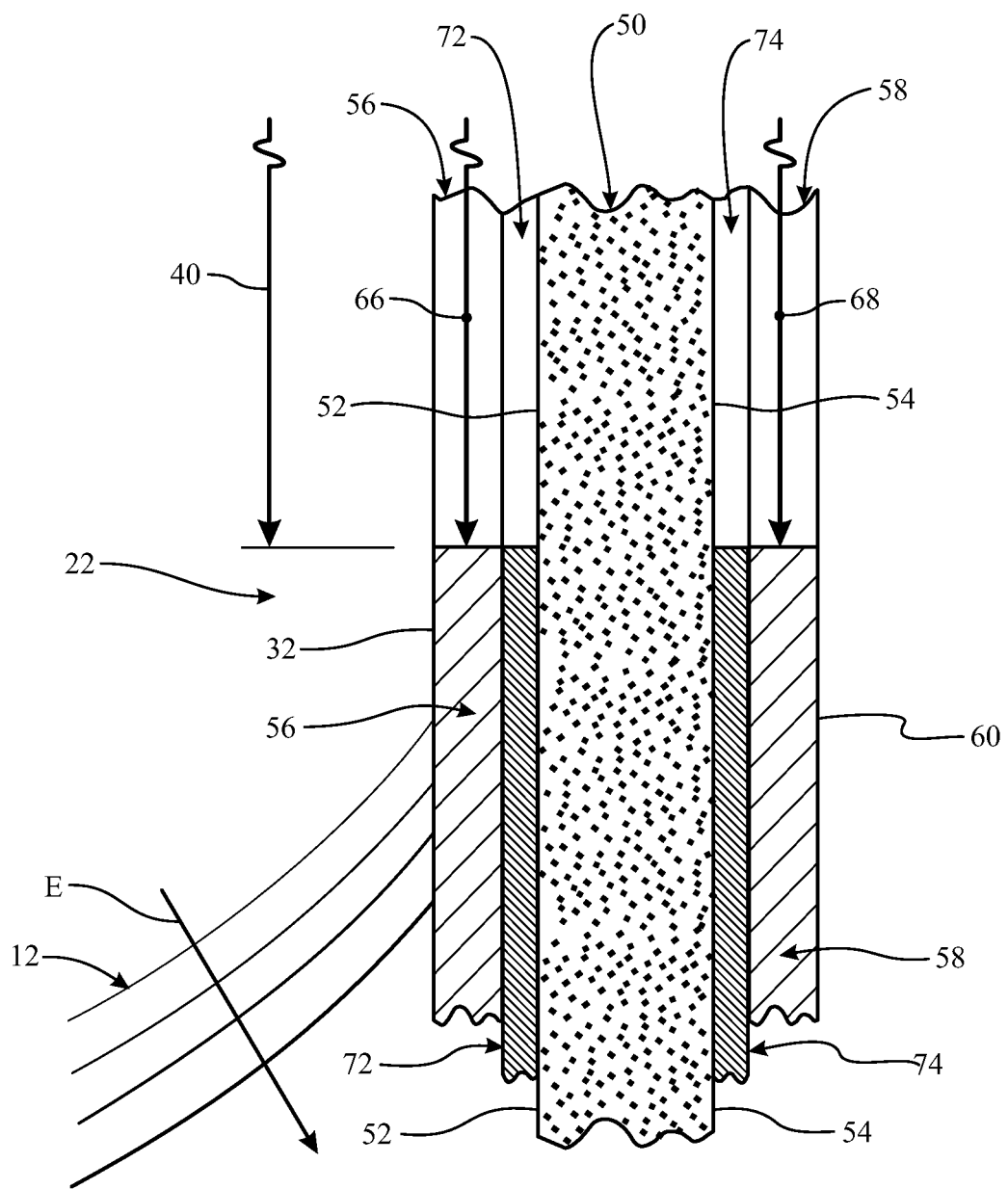
FIG. 3 is a highly enlarged view of the portion of FIG. 2 identified by detail arrow 3-3 therein.
Figure 4:
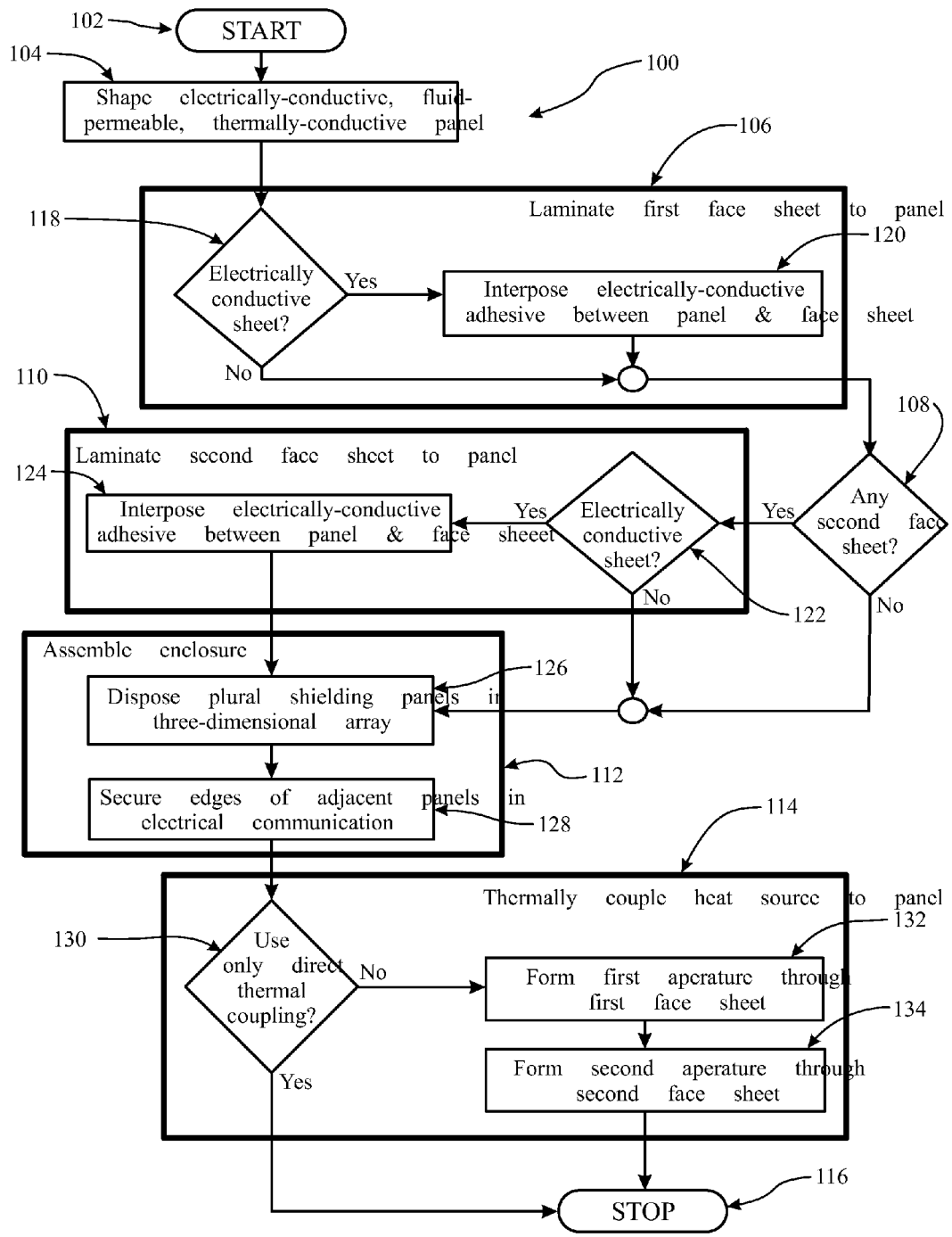
FIG. 4 is a flowchart of steps in an exemplary method employing teachings of the present invention to provide broadband electromagnetic shielding for an interior space.

FIG. 3 is a highly enlarged view of the portion of FIG. 2 identified by detail arrow 3-3 therein. Thus, FIG. 3 depicts the edge of temperature control vent 40 closest to side panel 26 in FIG. 2. Temperature control vent 40 is enabled by the combination of first aperture 66 formed through first face sheet 56 in proximity to second aperture 68 formed through second face sheet 58. These features render front panel 22 fluid-permeable in the vicinity of first aperture 66 and second aperture 68. A first adhesive layer 72 is interposed between first face sheet 56 and first surface 52 of core layer 50, while a second adhesive layer 74 is interposed between second face sheet 58 and second surface 54 of core layer 50. If either of first face sheet 56 or second face sheet 58 is electrically-conductive, then the adhesive layer associated therewith will advantageously also be electrically-conductive.

Thus, the teachings of the present invention include the use of open light-weight, electrically-conductive, fluid permeable materials as multifunctional structural core layer material for composite structures and as stand-alone broadband shielding air passage filters with properties that are in some ways superior to those made from wires, meshes, or honeycombs. Such materials may be metal foam, if open-cell and structurally-stable, or any porous metal structure, whether it be foam, felt, or non-woven. The core may be a metal-coated porous material, such as open-cell or closed-cell foam, felt, cloth, or fiber matting. The core may also be made of metal particles, metal-coated particles, or self-supporting metal nanostructures, such as liberated branching metal nanostrands. The use of high electromagnetic-permeable metals, such as nickel, copper-nickel, nickel-iron, and perm alloy is recommended, particularly for shielding from lower frequency electromagnetic radiation.

The use of these porous materials as a composite laminate core simultaneously provides for the multifunctional advantages of structural, electrical, and thermal improvements in conductive composite laminates, particularly where the face sheets of the composite are rendered electrically-conductive by being fabricated using electrically-conductive resins, electrically-conductive fibers, or electrically-conductive surfacing scrims. The tortuous three-dimensional structure of these materials provides greater electromagnetic broadband shielding than is available in structures employing linear or planar conductors, such as wires, meshes, or honeycombs.

A plurality of electromagnetic shield panels are disposed in a three-dimensional array surrounding an interior space requiring shielding for electromagnetic radiation. Each of the panels is bounded at the periphery thereof by a sequence of circumscribing edges. According to another aspect of the present invention, joinder means are provided for securing the edges of adjacent of the panels in the three-dimensional array with electrically-conductive components of the adjacent of the panels in electrical communication. Thus, it is of further advantage to employ electromagnetically-conductive coatings, electromagnetically-conductive adhesives, and electromagnetically-conductive gap fillers to mechanically and electrically interconnect the panels. Examples of structures performing the function of such a joinder means include a butt joint between the joint edge of adjacent panels and a lap joint between overlapping portions of adjacent panels.

In manufacturing a conductive composite, control is recommended of electrically conductivity and the electrical permeability of all constituent elements of the composite. In light of the series of equations provided earlier, the goal should be to make the overall composite structure as electromagnetically thick as possible. The surface, the resin, the reinforcing fibers, and the core adhesive employed in the composite should each be as electrically-conductive as permitted by circumstances of anticipated use. Nickel nanostrands may be employed to create electrically-conductive surfaces, resins, and adhesives. Nickel-coated paper and nickel-coated fibers are recommended when reinforcement is called for, either in an electrical or in a structural sense. If the electromagnetic conductivity of any component or phase of a composite is poor, then the performance of the entire composite system will be compromised and not optimized.

Nickel foam alone does a great portion of low frequency electromagnetic-shielding. Within nickel foam are air passages that permit fluid flow, while the nickel of the foam affords broadband electromagnetic shielding. In structural applications, both in rigid panels made with epoxy composite and in flexible panels made with an elastomeric matrix, greater electromagnetic-shielding is attained where the surface and structural element of a composite panel is rendered as electrically-conductive as possible. Such a comprehensive and specific approach to electrical conductivity is appropriate, where multiple panels employing porous core composites are to be joined in an electrically continuous fashion into a larger overall structure. Adhesives and gap fillers are capable of effecting the desired joiner, if electrically-conductive.

The teachings of present invention also includes methodologies. For example, within the scope of the present invention are methods for electromagnetically shielding an interior space and methods for manufacturing a temperature control panel for an electromagnetic shield.

By way of example, depicted in FIG. 5 are steps in a method 100 that accomplishes both of these diverse objectives. Method 100 commences at initiation oval 102 and proceeds as indicated in instruction rectangle 104 to the initial step of shaping a fluid-permeable, electrically-conductive material having a relatively high heat transfer coefficient into a substantially planar multipurpose electromagnetic-shielding and temperature moderating panel having first and second surfaces on opposite sides thereof. A plurality of such panels will typically be required. Then method 100 proceeds through a series of subroutines, each of which may or may not be required to achieve the objectives of a specific anticipated condition of use.

First, as required in subroutine enclosure 106, it is necessary to perform the step of laminating a first face sheet to the first surface of each panel. The first face sheet has rigidity properties that are superior to the rigidity properties of the panels themselves. Then, as suggested by decision diamond 108, it is necessary to ascertain whether a second face sheet is required on the second surface of each panel. If so, method 100 proceeds to subroutine enclosure 110, and the step ensues of laminating a second face sheet to the second surface of each panel. The second face sheet will in most instances have rigidity properties that are superior to the rigidity properties of each panel to which the second face sheet is laminated. Then, as well as if no second face sheet is needed, the panels are assembled as indicted in subroutine enclosure 112, into an electromagnetic shield for an interior space that is intended to contain a heat-generating device requiring protection from electromagnetic radiation. Finally, as shown in subroutine enclosure 114, the heat-generating device is thermally coupled to one or more of the panels in the electromagnetic shield produced in subroutine enclosure 112. Method 100 concludes in termination oval 116.

The steps in each of the subroutines of method 100 will be elaborated.

In subroutine enclosure 106, as suggested by decision diamond 118, it is necessary to ascertain whether the first face sheet needs to be electrically-conductive. If so, method 100 proceeds to instruction rectangle 120, and the step is undertaken of interposing an electrically-conductive adhesive between the first face sheet and the first surface of each panel. Then, as well as if no electrical-conductivity in the first face sheet is needed, method 100 progresses by way of decision diamond 108 discussed earlier to the procedures called for either in subroutine enclosure 110 or in subroutine enclosure 112.

In subroutine enclosure 110, as suggested by decision diamond 122, it is necessary to ascertain whether the second face sheet needs to be electrically-conductive. If so, method 100 proceeds to instruction rectangle 124, and the step is undertaken of interposing an electrically-conductive adhesive between the second face sheet and the second surface of each panel. Thereafter, method 100 progresses to the procedures called for either in subroutine enclosure 112.

In subroutine enclosure 112, as required first in instruction rectangle 126, the panels are disposed in a three-dimensional array surrounding the interior space that is to be protected from electromagnetic radiation. The edges of adjacent panels in the three-dimensional array are secured together in such a manner that electrically-conductive components in adjacent of the electromagnetically shielding shield panels are in electrical communication. Method 100 proceeds to the procedures called for in subroutine enclosure 114.

In subroutine enclosure 114, as suggested by decision diamond 130, it is necessary to ascertain whether thermal coupling of the heat-generating device inside the electromagnetic shielding produced in subroutine enclosure 112 is to be effected only directly, as for example by conduction, using a thermally-conductive element extending between the heat-generating device and the panel. If so, such an element is installed, and method 100 concludes. If not, indirect coupling using convection is to be used additional to or in lieu of direct coupling. Method 100 progresses to the step of forming a first aperture through the first face sheet, as called for in instruction rectangle 132. If a second face sheet was laminated to the panel, then the step ensues described in instruction rectangle 134 of forming a second aperture through the second face sheet opposite the first aperture. The first aperture and the second aperture together render the cooling panel fluid-permeable in the vicinity of the first and second apertures. Method 100 then concludes.

Many combinations of the components recommended above can be used to achieve a broad range of electromagnetic, thermal, and structural efficacy. Using the methods described, variously above, it is possible to build composite structures that will shield from electromagnetic signals that are well in excess of about eighty decibels below a frequency of one megahertz. Such structures have a stiffness of about $30 \times 10^6$ pounds per square inch, approximate the stiffness of steel, and a density of about 1.35 grams per cubic centimeter, less that half the density of aluminum. Typical electrical properties achievable include a surface resistivity of about less than or equal to 0.003 ohm-per-square and a volume resistivity in the range of from about 10E-2 ohm-centimeters to about 10E-5 ohm-centimeters.

By way of recapitulation, the following description of a high-performance electromagnetic-shielding system is provided.

An electrically-conductive, and optionally thermally-conductive, porous core composite panel structure is used as a broadband electromagnetic shield. The porous core may be metal foam, a porous self-supporting metal structure, metal particles, metal nanostrands, or a metal coated porous substrate, such as an open-cell or closed-cell foam, felt, cloth, fibrous matting, electrically-nonconductive coated particles. Highly electromagnetically-permeable metals, such as nickel, copper nickel, and perm alloy are recommended, particularly for the electromagnetic shielding from electromagnetic radiation at lower frequencies.

The face sheets used on a foam core need not be electrically-conductive, but more effective electromagnetic shielding is achieved, if the face sheets are electrically-conductive. This is particularly the case, when it comes to achieving electrical continuity between structurally adjacent constituent elements in a larger electromagnetic enclosure. The face sheets may be made conductive by the use of metal wires or meshes, metal coated fibers, conductive resins such as nanostrand bearing resins, and paper nickel-coated by chemical vapor deposition processes applied to the surface of the face sheets with nickel nanostrand bearing resins. The polymer resins employed in the face sheets range from a stiff epoxy to an elastomer. Correspondingly, the resulting composite panel will be rigid or flexible. The composite face sheets are joined to both faces of the electrically-conductive porous core with an electrically-conductive adhesive, such as an adhesive made conductive through the inclusion therein of nickel nanostrands.

Electrically-conductive coatings, adhesives, and elastomers are used to join panels, achieving mechanical integrity and electrical continuity. Though the porous electrically-conductive core alone is an excellent electromagnetic shield, electrically-conductive composite face sheets, resins, and adhesives provide significant improvement in the overall electromagnetic-shielding that can be produced.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. An interconnection structure in an electromagnetic shield to exhibit broadband shielding capability including low frequencies, the interconnection structure comprising:
 (a) a first electromagnetic shield panel bounded at a periphery thereof by a joint edge, the first panel comprising:
  (i) a first core layer that is light-weight, porous, electrically-conductive, and planar, the first core layer comprising a nonmetallic, electrically-nonconductive substrate with a metallic coating having nickel as a component, the first core layer having generally parallel inner and outer surfaces on opposite sides thereof and being bounded at a periphery thereof by a joint edge coincident with the joint edge of the first panel; and (ii) a first outer face sheet laminated to the outer surface of the first core layer, the first outer face sheet being electrically-conductive and having rigidity properties superior to the rigidity properties of the first core layer and being bounded at a periphery thereof by a joint edge coincident with the joint edge of the first panel;

(b) a second electromagnetic shield panel bounded at a periphery thereof by a joint edge, the second panel comprising:

(i) a second light-weight, porous, electrically-conductive planar core layer having generally parallel inner and outer surfaces on opposite sides thereof and being bounded at a periphery thereof by a joint edge coincident with the joint edge of the second panel; and (ii) a second outer face sheet laminated to the outer surface of the second core layer, the second outer face sheet having rigidity properties superior to the rigidity properties of the second core layer and being bounded at a periphery thereof by a joint edge coincident with the joint edge of the second panel; and (c) joinder means for securing the joint edge of the first panel to the joint edge of the second panel with electrically-conductive components of the first panel in electrical communication with electrically-conductive components of the second panel.

2. An interconnection structure as recited in claim 1, wherein the joinder means comprises a butt joint between the joint edge of the first panel and the joint edge of the second panel.

3. An interconnection structure as recited in claim 1, wherein the joinder means comprises a lap joint between overlapping portions of the first and second panels located adjacent, respectively, to the joint edges thereof.

4. An interconnection structure as recited in claim 1, wherein the interconnection structure further comprises:
  (a) a first outer electrically-conductive adhesive layer between the outer surface of the first core layer and the first outer face sheet; and
  (b) a second outer electrically-conductive adhesive layer between the outer surface of the second core layer and the second outer face sheet.

5. An interconnection structure as recited in claim 1, further comprising:
  (a) an electrically-conductive first inner face sheet having rigidity properties superior to the rigidity properties of the first core layer and being bounded at a periphery thereof by a joint edge coincident with the joint edge of the first panel;
  (b) a first inner electrically-conductive adhesive layer between the inner surface of the first core layer and the first inner face sheet;
  (c) an electrically-conductive second inner face sheet having rigidity properties superior to the rigidity properties of the second core layer and being bounded at a periphery thereof by a joint edge coincident with the joint edge of the second panel; and
  (d) a second inner electrically-conductive adhesive layer between the inner surface of the second core layer and the second inner face sheet.

6. An interconnection structure as recited in claim 1, wherein the second core layer comprises nickel as a component.

7. An interconnection structure as recited in claim 6, wherein the second outer face sheet is electrically-conductive.

8. An interconnection structure as recited in claim 7, wherein the interconnection structure further comprises:
  (a) a first outer electrically-conductive adhesive layer between the outer surface of the first core layer and the first outer face sheet; and
  (b) a second outer electrically-conductive adhesive layer between the outer surface of the second core layer and the second outer face sheet.

9. An interconnection structure as recited in claim 1, wherein the first core layer is fluid permeable.

10. An interconnection structure as recited in claim 1, wherein the second core layer is fluid permeable.

11. An interconnection structure as recited in claim 1, wherein the first electromagnetic shield panel shields from electromagnetic signals in excess of eighty decibels below a frequency of one megahertz.

12. An interconnection structure as recited in claim 1, wherein the second electromagnetic shield panel shields from electromagnetic signals in excess of eighty decibels below a frequency of one megahertz.

* * * * *